(12) United States Patent
Lenhard et al.

(10) Patent No.: US 8,941,373 B2
(45) Date of Patent: Jan. 27, 2015

(54) CURRENT SENSOR ARRANGEMENT

(75) Inventors: Friedrich Lenhard, Hanau (DE); Sebastian Kudimow, Hanau (DE)

(73) Assignee: Vacuumschmelze GmbH & Co. KG, Hanau (DE)

( * ) Notice: Subject to any disclaimer, the term of this patent is extended or adjusted under 35 U.S.C. 154(b) by 151 days.

(21) Appl. No.: 13/559,819

(22) Filed: Jul. 27, 2012

(65) Prior Publication Data

US 2013/0027024 A1    Jan. 31, 2013

(30) Foreign Application Priority Data

Jul. 28, 2011 (DE) .......... 10 2011 080 039

(51) Int. Cl.
*G01R 15/18* (2006.01)
*G01R 33/02* (2006.01)
*G01R 15/20* (2006.01)

(52) U.S. Cl.
CPC ............ *G01R 15/185* (2013.01); *G01R 15/186* (2013.01); *G01R 15/207* (2013.01)
USPC .......................................... 324/127; 324/244

(58) Field of Classification Search
CPC .... G01R 15/185; G01R 15/207; G01R 15/20; G01R 19/00; G01R 15/18
USPC ............. 324/51, 55, 244, 227, 228, 236, 253, 324/127
See application file for complete search history.

(56) References Cited

U.S. PATENT DOCUMENTS

| | | | |
|---|---|---|---|
| 3,895,336 A | 7/1975 | Pitman | |
| 4,939,448 A | 7/1990 | Gudel | |
| 5,565,765 A | 10/1996 | Lenhard | |
| 6,218,927 B1* | 4/2001 | Segal | 336/216 |
| 6,388,549 B1* | 5/2002 | Lenhard | 336/200 |
| 6,794,860 B2* | 9/2004 | Schafer | 324/117 H |
| 6,844,799 B2* | 1/2005 | Attarian et al. | 335/18 |
| 7,400,131 B2* | 7/2008 | Preusse | 324/117 R |
| 2007/0046280 A1* | 3/2007 | Vilas Boas | 324/126 |
| 2009/0015093 A1* | 1/2009 | Reutter et al. | 310/254 |

FOREIGN PATENT DOCUMENTS

| | | |
|---|---|---|
| AT | 108862 | 2/1982 |
| CN | 1062792 A | 7/1992 |
| CN | 2300108 Y | 12/1998 |
| DE | 19705767 A1 | 8/1998 |
| DE | 19941169 | 3/2001 |
| DE | 102005028572 A1 | 12/2006 |
| DE | 602004006028 T2 | 3/2008 |

(Continued)

OTHER PUBLICATIONS

Corresponding German Appl. No. 102011080039.5, Office Action, dated Aug. 17, 2012, 10 pages.

(Continued)

*Primary Examiner* — Tung X Nguyen
*Assistant Examiner* — Raul Rios Russo
(74) *Attorney, Agent, or Firm* — Dickinson Wright PLLC

(57) ABSTRACT

A current sensor comprising a primary conductor for conducting a current that is to be measured, at least two magnetic field probes for measuring magnetic fields, and a magnetic core, which has a closed ring structure having three or more corners that encloses the primary conductor, wherein each magnetic field probe is arranged on the magnetic core or in recesses in the magnetic core.

14 Claims, 5 Drawing Sheets

(56) References Cited

FOREIGN PATENT DOCUMENTS

| EP | 0132745 | A2 | 2/1985 |
|---|---|---|---|
| EP | 0294590 | A2 | 12/1988 |
| EP | 0510376 | A1 | 10/1992 |
| EP | 0691544 | A2 | 1/1996 |
| EP | 1010014 | A2 | 6/2000 |
| GB | 1529967 | | 10/1978 |
| GB | 2096835 | | 10/1982 |
| JP | 2006-32786 | | 2/2006 |
| WO | 9212432 | A1 | 7/1992 |
| WO | 9852052 | A2 | 11/1998 |

OTHER PUBLICATIONS

Office Action for CN 201210262933.9 dated Jun. 20, 2014.

* cited by examiner

CURRENT SENSOR ARRANGEMENT

This application claims benefit of the filing date of DE 10 2011 080 039.5, filed Jul. 28, 2011, the entire contents of which is incorporated by reference herein for all purposes.

BACKGROUND

1. Field

Disclosed herein is a current sensor arrangement with a magnetic module, in particular for use as a compensation current sensor.

2. Description of Related Art

In the non-contact measurement of current, first and foremost current sensors are used, in which the magnetic field, which is produced by a current (primary current) that is to be measured and that flows through a so-called primary conductor, is evaluated, and the current that actually flows into the primary conductor is determined therefrom. Current sensors that operate without contact, i.e., that have no galvanic contact with the primary conductor, are primarily used with high currents.

Current sensors can be configured in a variety of ways, in particular with respect to the magnetic field sensors and magnetic modules that are used there. Magnetic field sensors are mainly sensor types that operate inductively or based on the Hall Effect. To bundle or to conduct the magnetic field, soft-magnetic elements (e.g., magnetic cores) are used, which are a minimum component of a magnetic module.

For example, in the so-called compensation current sensors, in which the magnetic field that is produced by the primary current is compensated to zero by a magnetic field that is produced by a compensation current of known strength, a magnetic core of closed structure, such as, for example, a circular or rectangular ring structure, is used as a soft-magnetic element, whereby an air gap is provided for receiving a magnetic field probe. By means of the magnetic field probe, the residual magnetic field, which is what remains in this case incomplete compensation, is measured, and the compensation current is correspondingly readjusted. In this case, the compensation current is a measurement for the primary current. In particular, in the measurement of higher electrical currents, for example above 500 A, however, various problems occur.

For example, primary conductors in the case of high currents have a correspondingly large cross-section. In the case of compensation current sensors for high currents, to keep the overall dimensions of the magnetic module as small as possible, the geometry of the inside opening of the magnetic module that accommodates the primary conductor should be selected in such a way that the free space between the magnetic module and the primary conductor is as small as possible. However, the primary conductors can have both round and rectangular cross-sections, so that the magnetic modules can be optimized only for a primary conductor cross-section in each case, and other primary conductor cross-sections cannot be used or can be used only with limitations.

If the magnetic module, for example, has a rectangular inside opening, for example for receiving a strip-like conductor, then only two sides of the core can generally be provided with windings; this limits the possible measuring area and the non-linearities of the current sensor, by which in turn falsifications of the measuring outcome (measuring errors) are produced. When a circular, uniformly wound single-aperture core is used, this is not a problem, but the winding expense is increased in this case and thus the total price is increased considerably, whereby, moreover, measurements can be made on a primary conductor with a rectangular cross-section with a given single-aperture core with a round inside opening only with a reduced cross-sectional surface of the conductor and thus with a reduced maximum primary current.

Another problem consists in the fact that magnetic modules in higher primary currents and thus accompanying larger cross-sectional surfaces of the primary conductor require a sensor core of corresponding size to be able to guide the "larger" primary conductor through the inside opening. As the primary current increases, moreover, the effects of an asymmetrical magnetic modulation of the core are magnified, when, for example, the position of the electric conductor is not secure in the inside opening and partial saturations of the magnetic module then occur. Non-linearities and thus measuring errors can be caused by such saturations.

Since even though in a conventional compensation current sensor, the magnetic field in the air gap is kept essentially to zero, relatively large magnetic fields can occur at other areas of the magnetic core since compensation current and primary current are not compensated there because of stray flux. This results in large measuring errors, which thus far have been counteracted by large core cross-sections.

SUMMARY

An objective of certain embodiments disclosed herein is therefore to prepare a current sensor arrangement that is improved by comparison to previous arrangements, and that avoids some or all of the problems noted above.

Some or all of the advantages and objectives disclosed herein are achieved in particular by one or more embodiments of a current sensor arrangement with a primary conductor for conducting a current that is to be measured, at least two magnetic field probes for measuring magnetic fields, and a magnetic core, which has a closed, three- or multi-cornered ring structure that encloses the primary conductor, whereby the magnetic field probe is arranged on the magnetic core or in recesses in the magnetic core.

BRIEF DESCRIPTION OF DRAWINGS

The invention is explained in more detail below based on the embodiments that are shown in the figures of the drawing, whereby the same or similar elements are provided with the same reference numbers. Here.

DETAILED DESCRIPTION OF SPECIFIC EMBODIMENTS

Figure 1:
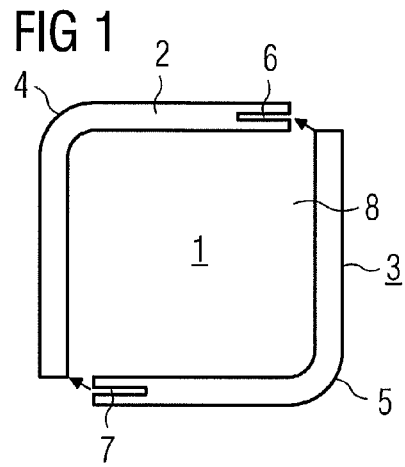
FIG. 1 shows, in a schematic diagram, a still disassembled two-part magnetic core of a ring structure, approximately rectangular in the assembled state, with a pocket-like recess on one end of the two magnetic core parts in each case.

FIG. 1 shows a two-part magnetic core 1 (for example for use in a magnetic module of a current sensor, in particular a compensation current sensor) in the still disassembled state. The two parts of the magnetic core 1 are in this case formed by two identically-designed legs 2 and 3 that are curved in an L shape, of which each, for example, has a rectangular or otherwise suitable core cross-section (not shown), and has a rod-shaped core that, for example, is bent 90° in the middle and accordingly has bends 4, 5. In this case, the bends 4 and 5 can be designed exactly at right angles with sharp edges or else—as shown—rounded or beveled in any way. In each case, on a front side of such a rod, recesses 6 or 7 are provided that run in the longitudinal direction of the rod and that are provided for receiving magnetic field probes. In this case, the recesses 6 and 7 can be designed in such a way that they are enclosed on all sides of the core material with the exception of a small pass-through for feeders of the magnetic field sensors or are open on one or two sides.

During assembly of the core 1, the two legs 2 and 3 are then arranged on one another in such a way that the front side of the leg end that has the recess 6 or 7 adjoins flush on the lateral surface of the end of the respective other leg 3 or 2. Thus, the recess 6 or 7 is covered on the front side. In the event that a recess is open only at one point, the front side, attention would still be paid to the possibility of supplying lines for the magnetic field probe. In the assembled state, an inner opening 8 to allow a primary conductor to pass through is produced, which is closed to a large extent and is surrounded by the magnetic core 1 in the shape of a ring. The joints between the legs 2 and 3 in this case form air gaps, which, however, have a low gap width, for example smaller than 0.1 mm. In general, the space between two surfaces that lie close together opposite one another is termed an air gap. The gap width in this case is the distance between the two surfaces in a perpendicular line from one another. The effective gap width is the distance, converted to flat surfaces, of separated, non-flat structures.

Figure 2:
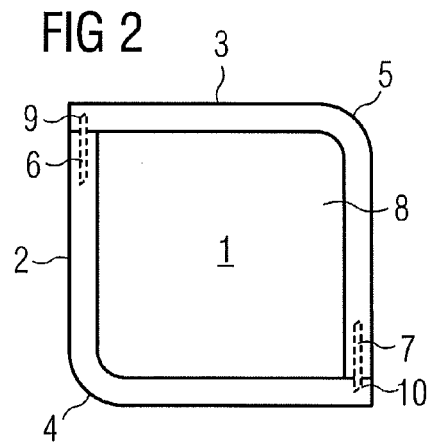
FIG. 2 shows, in a schematic diagram, an assembled two-part magnetic core of an approximately rectangular ring structure with pocket-like recesses corresponding to one another at the joints on both ends of the two magnetic core parts.

A variant of the magnetic core 1 that is shown in FIG. 1 is depicted in FIG. 2. In this case, the recesses 6 or 7 in the legs 2 or 3 or in the other legs 3 or 2 that are adjacent in each case are extended in the form of recesses 9 or 10. The recesses 9 or 10 thus extend perpendicularly to the longitudinal direction of the respective leg end in contrast to the recesses 6 and 7, which extend at the other leg end, in each case in the longitudinal direction. The recesses 6, 7, 9, 10 are thus perpendicular to the interfaces that occur at the joints and allow the introduction of magnetic field probes for the measurement of the magnetic flux in the respective air gap, not withstanding its smaller gap width.

Figure 3:
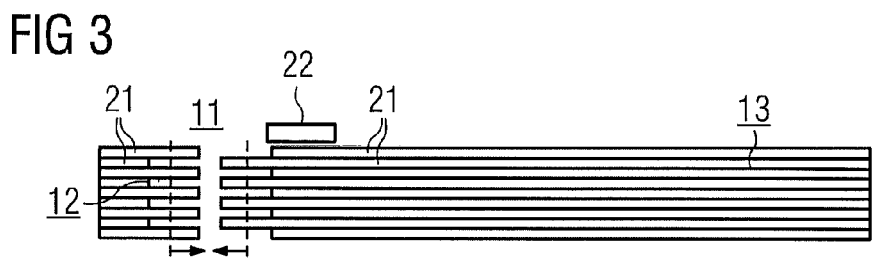
FIG. 3 shows, in a schematic diagram, a section of a magnetic core, formed from layers of sheet-metal, with overlapping core layers on a joint of the two magnetic core parts.

FIG. 3 shows another basic possibility of designing joints between two legs 12 and 13 of a magnetic core 11. Unlike in the embodiments of FIGS. 1 and 2, the two legs 12 and 13 at their joints do not adjoin flush in the surface (flat surfaces), but rather overlaps (non-flat surfaces) are provided, in such a way that—as shown—for example in an alternating sequence in one direction (or in any other sequence and/or in one or more other directions), pieces of sheet-metal of a sheet-metal packet that forms the core are shifted to the rear at a right angle to an imaginary interface that represents the joint (indicated by dashed-dotted lines in the drawing), and the respective counterpart, i.e., the corresponding sheet-metal layer of the respective other leg, projects away over the interface. In this case, FIG. 3 shows the legs 12 and 13 in the disassembled state. The overlaps occur only when the magnetic cores are assembled, such as, for example, by being pushed together (indicated by arrows in the drawing). At the joints, spatially different air gaps are formed, which have still smaller effective gap widths because of the overlaps relative to the magnetic cores shown in FIGS. 1 and 2.

Figure 4:
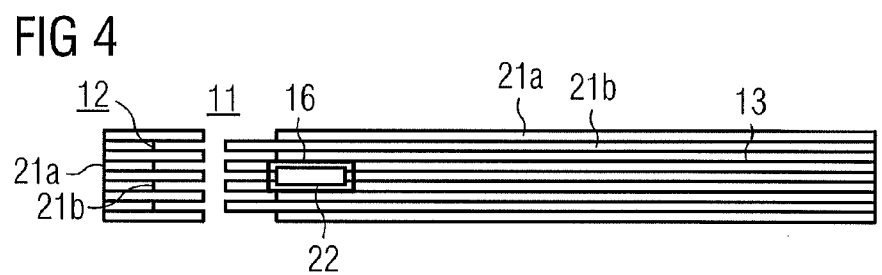
FIG. 4 shows, in a schematic diagram, the magnetic core according to FIG. 3 with a recess at the joint as well as with layers of sheet-metal of different core sheet-metal types.

FIG. 4 relates to a further development of the arrangement of the legs 12 and 13, shown in FIG. 3, in which the sheet-metal layers are produced from different core sheet-metal types, such as, for example, different alloys, or with different thicknesses. In this embodiment, moreover, a recess 16 is provided in the leg 13, in which a magnetic field sensor 22 can be installed. The magnetic field sensor 22 can—as depicted in FIG. 3—alternately be placed not in the recess but rather on the inside (inside wall) of the magnetic core, so that it is then located between the primary conductor and the magnetic core.

Figure 5:
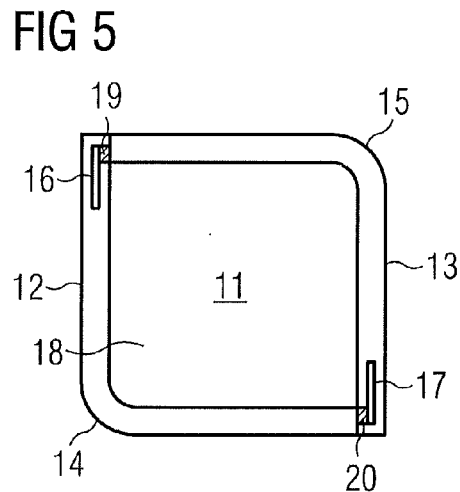
FIG. 5 shows, in a schematic diagram, an assembled two-part magnetic core with an approximately rectangular ring structure and partial overlaps at the joints.

FIG. 5 shows the magnetic core 11 according to FIG. 3 or 4 in its entirety and in the assembled state, whereby the latter is similar in its basic structure to the magnetic cores 1 of FIGS. 1 and 2. The magnetic core 11 that is made in two parts in this case comprises, as already indicated, the two legs 12 and 13, which are designed to have a rodlike shape and are bent at right angles, producing a bend 14 or 15 in the center. The bends 14 and 15 are also designed to have a rounded shape in this magnetic core 11, but can be designed in any other suitable form, such as, for example, with flat areas at the corners to a more than quadrilateral magnetic core. As also in the embodiments according to FIG. 1 and FIG. 2, the front side adjoins one end of a leg 12 or 13 to the lateral surface on the other end of the respective other leg 13 or 12. The legs 12 and 13 have recesses 16 or 17 on the end that with its front surface abuts in each case the front surface of the other leg, whereby said recesses are not, however, open in the direction of the respective other leg 13 or 12. In this case, the openings are provided at least on one surface that is perpendicular to the surfaces adjoining one another.

Unlike with the magnetic cores 1 shown in FIGS. 1 and 2, overlaps 19 or 20, as in FIGS. 3 and 4, are also partially provided with the magnetic core 11 according to FIG. 5 at the joints, i.e., in a part of the weld area (joint). In this connection, the overlaps 19 and 20 extend, for example, only over a portion, but not over the entire width, of the two legs 12 and 13. At the remaining points, the joint is embodied as in the magnetic cores 1 according to FIGS. 1 and 2, i.e., the front side of one end of a leg adjoins flush on the lateral surface of the end of the respective other leg. Recesses 16 and 17 run in the longitudinal direction of the leg ends. A probe that is arranged in the recesses 16 and 17 (not shown) thus adjoins the overlaps 19 and 20 and thus the air gaps.

Figure 6:
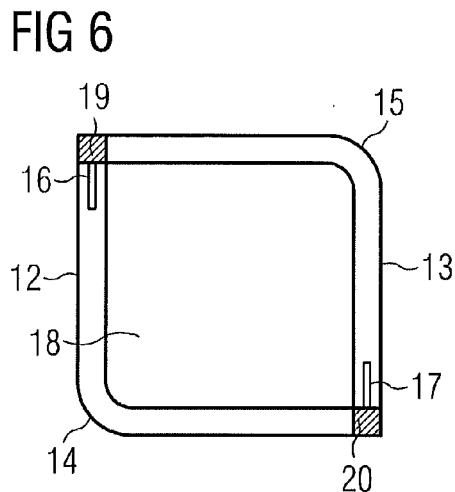
FIG. 6 shows, in a schematic diagram, an assembled two-part magnetic core with an approximately rectangular ring structure and complete overlaps at the joints.

Relative to the magnetic core 11 that is shown in FIG. 5, the magnetic core 11 that is shown in FIG. 6 is modified to the extent that now the overlaps 19 and 20 extend over the entire cross-sectional surfaces of both legs 12 and 13 with partial inclusion of the recesses 16 and 17. A probe (not shown) that is placed therein thus also detects the overlaps 19 and 20 and thus the air gaps.

Figure 7:
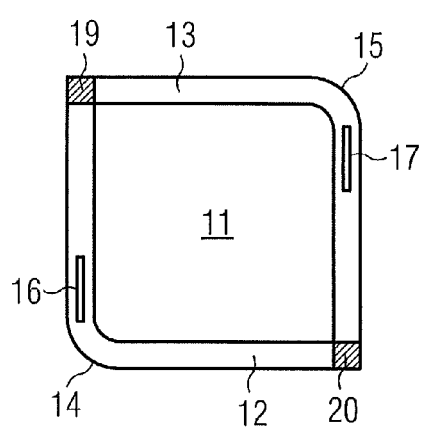
FIG. 7 shows, in a schematic diagram, an assembled two-part magnetic core with an approximately rectangular ring structure, complete overlaps at the joints and recesses located away from the joints.

The magnetic core 11 that is shown in FIG. 7 is changed relative to the magnetic core 11 according to FIG. 6 to the extent that the recesses 16 and 17 in each case were offset away from the joints and toward the bends 14 or 15 which are rounded in the embodiment illustrated. Also, with the magnetic core 11 according to FIG. 7, the overlaps 19 and 20 extend over the entire width of the two legs 12 and 13. The recesses, however, do not adjoin the overlaps 19 and 20; i.e., they do not adjoin the air gaps. Since, however, the effective air gaps that occur at the overlaps 19 and 20 have an extremely low effective gap width, the error by offset magnetic field sensors, i.e., not arranged on or in the air gaps, is also low, since the stray flux at the air gaps is only slightly different from the other areas.

Figure 8:
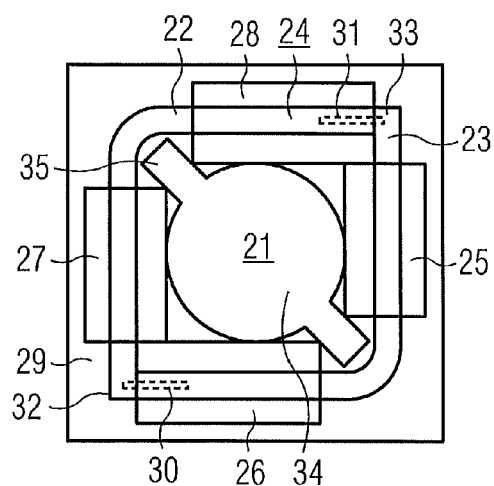
FIG. 8 shows, in a schematic diagram, a magnetic module with an assembled two-part magnetic core of approximately rectangular ring structure, four windings as well as a primary conductor guide designed for rectangular and round cross-sections.

FIG. 8 shows a magnetic module 21 with a magnetic core 24 of approximately rectangular ring structure, assembled from two legs 22 and 23—i.e., in two parts—four windings 25 to 28 applied thereon, as well as a primary conductor guide 29 that is designed for rectangular and round cross-sections. The core 24, moreover, has two recesses 30 and 31, which in each case are arranged near the joints of the two legs 22 and 23. At the joints, overlaps are provided in the regions indicated by numerals 32 and 33 (but are not shown for the sake of clarity) which extend over the entire width of the two legs 22 and 23 and also partially cover the recesses 30 and 31. The core 24 therefore essentially corresponds to the core that is described in more detail with respect to FIG. 6.

The windings 25 to 28 that are arranged on the core 24 are arranged in this case in such a way that they are located respectively on one of the leg sections on both sides of the bends of both legs 22 and 23 (corresponding to four leg sections with one winding each) and as close as possible to the joints between the two legs 22 and 23. With this embodiment, the recesses 30 and 31 that are located at the air gaps are covered as much as possible by the windings 26 and 28. The respective other windings 25 and 27 in each case adjoin the windings 28 and 26. Since all windings 25 to 28 of smaller length are smaller than half the leg length, i.e., smaller than the distance between the bending peak and the end of the respective leg (leg section), space remains in the area of the bends, which is not filled by the windings and thus is available for the positioning of the primary conductors with rectangular cross-sections.

The special arrangement of the windings 25 to 28 allows, moreover, a primary conductor with a round cross-section to be installed in the interior space of the wound core 24, namely in such a way that the remaining interior space that is surrounded by the wound core 24 ensures an improved use of the interior space relative to a purely rectangular or round design of the cross-section for both primary conductors with round cross-sections and with rectangular cross-sections. This means that the remaining interior space that is not used by the primary conductor when using primary conductors with rectangular cross-sections is smaller than in the case of round openings, and when using primary conductors with round cross-sections, it is more advantageous than in the case of openings with rectangular cross-sections. The position of a primary conductor with a rectangular cross-section and with a round cross-section is overlapping, such that, for example, its middle point or focus comes to lie on the same point (co-central arrangement), whereby the longer side of the rectangular cross-section projects over the round cross-section, for example diagonally to the bends.

To ensure a stable position of the primary conductor independently of whether the latter has a round or rectangular cross-section, the primary conductor guide 29 is provided, which ensures the above-described positions of primary conductors with round or rectangular cross-sections by corresponding openings 34, 35 and thus prevents an asymmetrical position of the primary conductor.

In the magnetic module that is shown in FIG. 8, different remarkable advantages are achieved by a series of features.

One of the features provides that two or more small air gaps are distributed over the periphery of the annular core—in particular uniformly. The (effective) width of the air gaps in each case is, for example, below 0.1 mm. The magnetic fluxes in the air gaps can be evaluated in the embodiments that are shown by magnetic field probes, which are arranged in the recesses 6, 7, 16, 17, 30 and 31, considering FIGS. 1-2, 4-7, and 8, respectively. As magnetic field sensors, for example, inductively-operating sensors (with microcoils) or magnetic field sensors in chip form, based on the Hall Effect, and which are arranged in recesses, are suitable.

By the use of several "smaller" air gaps, the middle flux can be minimized in an advantageous way. If, however, there is only one recess and thus only one magnetic field probe, the field of the primary conductor is centered on one point of the magnetic core, which then can result in that the magnetic field is zero on the magnetic field probe and is almost saturated at another point of the magnetic core. The use of at least two probes as disclosed herein results in that on the one probe, the field has half-negative saturation and the other probe experiences half-positive saturation, which as a result keeps the overall error considerably smaller. Moreover, compared to conventional arrangements, the arrangement disclosed herein allows considerably reduced average flux because of the smaller air gaps, and the use of at least two magnetic field probes, so that the necessary core cross-section can be considerably reduced.

The circuit of the magnetic field probes can be different in this case. On the one hand, only a single control circuit could be provided, which is based on the mean value of the signals from the individual magnetic field probes. On the other hand, any magnetic field probe could be assigned in each case an individual control circuit, which then could control groups of corresponding (compensation) windings. The last-mentioned principle could be carried out, for example, in the magnetic module 21 that is shown in FIG. 8, in that a magnetic field probe and the two windings 26 and 27 that are placed with respect to recess 30 are assigned to a first control circuit, while a magnetic field probe that is installed in recess 31 is assigned to a second control circuit in connection with the windings 25 and 28. In the first-mentioned case, the mean value was formed from the two magnetic field probes installed in the recesses 30 and 31, and fed to a single control circuit, which then controls all windings 25 to 28. Which of the two solutions is preferred or whether optionally mixed forms from both basic principles are used depends on the respective individual case, but all are within the scope of embodiments disclosed herein.

Another advantage of this invention follows from the fact that conductors for supplying higher currents have to have a large cross-section corresponding to their current. Therefore, it is necessary, in the detection of higher currents, to select the geometry of the inside hole of the sensor in such a way that a primary conductor with a corresponding cross-section can be run through without, in this case, however, the magnetic cores having to be sized unnecessarily large. Since in the case of high currents, frequently also conductor rails with rectangular cross-sections instead of round conductors are used, the magnetic module should be able to accommodate both geometries in a satisfactory manner. If a magnetic module is selected with a wound, round single-aperture core, an approximately round opening of the guide of the primary conductor is produced by the core geometry that under the same frame conditions is not suitable, however, for the accommodation of a conductor rail with comparable current-carrying capacity, such as the primary conductor with a round cross-section.

A similar issue occurs in the reverse case, i.e., in magnetic modules designed for conductor rails with corresponding rectangular openings. These are suitable only for conductor rails, but not for round conductors. The magnetic module shown in FIG. 8 now allows use of both cross-sectional variants, without having to accept the end smears as is necessary in the conventional embodiments. In this case, the embodiment that is shown in FIG. 8, for example, can be even better matched to the conductor rails, by, for example, the rounded bends being provided with larger radii of curvature or the curves being provided by beveling or flat areas until the multi-cornered cores have more than four corners, so that conductor rails with a lower aspect ratio can be used.

Moreover, round, closed single-aperture cores are advantageous relative to the symmetry of the winding (for example, a full winding is possible), but disadvantageous with respect to the winding expense. In magnetic cores that are optimized for conductor rails, in most cases windings can be provided only along the two longer sides of the conductor rails, which leads to asymmetries and thus to non-linearities. In the embodiments located herein, however, the winding is less expensive.

The magnetic module that is shown in FIG. 8 also offers advantages here, in particular in its production, such as, for example, the winding of the magnetic core. Multi-cornered cores shown in the embodiments disclosed herein consist of at least two core legs, which are put together from, for example, punched core pieces of sheet-metal, which allows a simple and thus economical assembly. The selected shape of the leg allows all sides of the magnetic core to be equipped with layer windings, which has a positive effect on the dynamic behavior of the sensor, but allows a simple winding in contrast to, for example, closed single-aperture cores. Finally, the rounded or flattened corners are used not only for an improved arrangement of the primary conductor but rather also allow a better magnetic flux guide.

In addition, the stray flux is greatly reduced by the small width of the air gap. When, in addition, the magnetic field is measured and adjusted, and then distributed via several probes over the periphery, the mean magnetic flux can also be minimized. A reduction of the effective gap width of below 0.1 mm is achieved, for example, in an embodiment where the core itself is built up from several core sheet-metal layers. In this case, at the joints between the two legs, the layers are designed to overlap around an imaginary boundary line, i.e., a position of one leg and then the position of the other leg alternately projects over this imaginary boundary line and the corresponding position of the other leg is in this connection respectively shortened, as is shown in detail in the embodiments according to FIGS. 3 and 4. Thus, an effective gap width of far below 0.1 mm can be achieved.

In addition, it can be provided that two different core sheet-metal types are used in the core sheet-metal layers of the magnetic core. In the finished core, because of the two legs, each layer consists of two core pieces of sheet-metal of the same type, and one layer of the first type is stacked alternately on the layer of the second type, etc., so that the points of contact of each layer are located alternately at different positions.

Since the air gaps are very small and, in particular with respect to the stray flux, there is no major difference compared to fully closed cores, the recesses also can be arranged at other points of the core instead of at the joints, however, as shown in FIG. 7.

In detail view, FIGS. 9 to 22 show various exemplary configurations of joints of two L-shaped legs 36 and 37, whereby recesses 38, 40 and, in part, overlaps 39 are provided. The magnetic core in this case can be produced from two different L-shaped core sheet-metal types. Two L-shaped pieces of sheet-metal of the same type that are joined together in each case form a sheet-metal layer.

Figure 9:
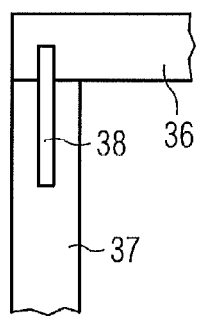
FIG. 9 shows, in a detailed view, a joint as it is used in the arrangement according to FIG. 2.

FIG. 9 shows in detail a joint as it is used in the arrangement according to FIG. 2. The front side of the leg 37 in this case adjoins flush on the long side of the leg 36, and the recess 38 extends in both legs 36, 37.

Figure 10:
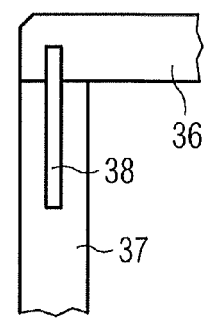
FIG. 10 shows, in a detailed view, a joint according to FIG. 9 with an inclined corner.

FIG. 10 shows the magnetic core from FIG. 9 with an inclined corner or outside edge. The inclined corner or outside edge in this case is provided only because of the more advantageous shaping and not because of possible advantages in magnetic behavior. Moreover, in the magnetic cores that are shown in FIGS. 11 to 19, the legs 36, 37 are joined to one another by alternating layers of sheet-metal layers at the joints. The darker surfaces indicate such areas with overlaps 39. The larger the overlapping surface is, the more symmetrical the field distribution in the magnetic core is and the smaller the effective gap width.

Figure 11:
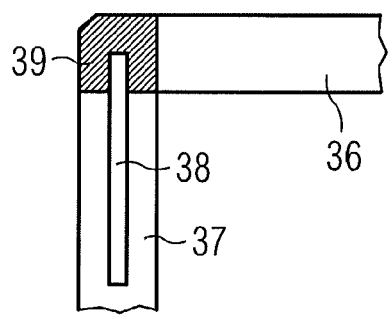
FIG. 11 shows, in a detailed view, a joint that is similar to that of FIG. 10 with overlaps between the core layers.

As shown in FIG. 11, a joint can have, for example, such overlaps 39 between the core layers similar to FIG. 10. In this case, the basic structure corresponds in the assembled state to that of FIG. 10, but the joint is designed differently, namely in such a way that the recess 38 is alone introduced into the leg 37, and the joint (junction) is located on the long side of the leg 37.

Figure 12:
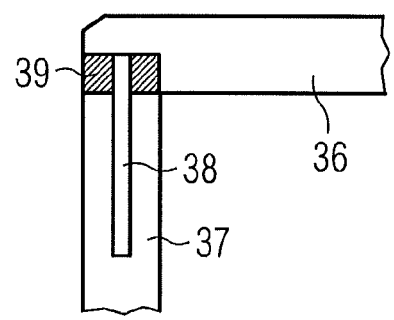
FIG. 12 shows, in a detailed view, a joint at which one of the legs has a tapering to the joint, and overlaps are provided between the core layers as well as beveling to the outside edge.

FIG. 12 shows a joint, in which one of the legs 36 has a tapering or cut-out to the joint. The basic structure corresponds in this case in the assembled state to that of FIG. 10, but the joint is designed differently in such a way that the recess 38 is alone introduced into the leg 37 and the entire leg 37 including the recess 38 extends into an indentation that forms the cut-out or tapers the leg 36. In this case, the indentation provides for a stepped closing-off of the leg 36.

Figure 13:
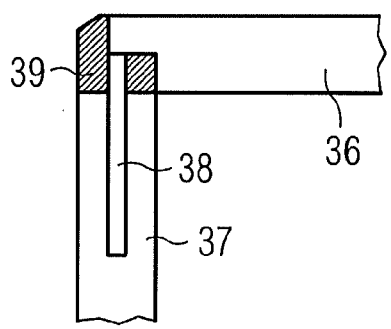
FIG. 13 shows, in a detailed view, a joint, in which both legs have a tapering to the joint, and overlaps are provided between the core layers as well as beveling to the outside edge.

FIG. 13 shows a joint, in which two legs 36, 37 in each case have an indentation that forms a cut-out (tapering) to the joint. In this case, the "junction" between the legs has a multi-stage progression.

Figure 14:
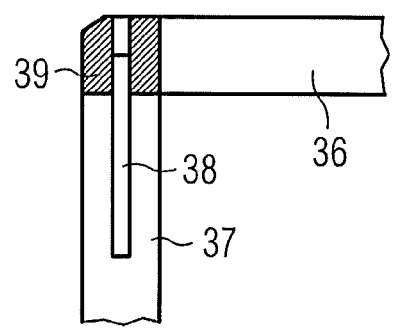
FIG. 14 shows, in a detailed view, a joint according to FIG. 1, in which the legs are arranged opposite one another, and overlaps are provided between the core layers as well as beveling to the outside edge.

FIG. 14 relates to a joint according to FIG. 1, in which the legs 36, 37 are arranged opposite one another. The recess 38 in this case is open to the front side of the leg 37, and the leg 36 adjoins flush on the long side of the leg 37. As for confirmation that this figure is correct with shading 39.

Figure 15:
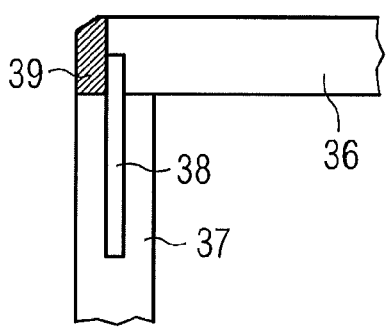
FIG. 15 shows, in a detailed view, a joint according to FIG. 13 with other configurations of the tapering and the overlap area of the legs.

FIG. 15 shows a joint according to FIG. 13 with an alternative configuration of the tapering and the overlap areas of the legs 36, 37 in such a way that relative to the embodiment that is shown in FIG. 13, the indentation in the leg 36 turns out to be smaller and that in the leg 37 turns out to be larger in volume, with a corresponding reduction of the overlap area.

Figure 16:
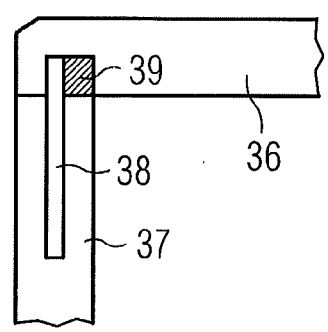
FIG. 16 shows, in a detailed view, a joint according to FIG. 13 with, in turn, other configurations of the tapering and the overlap area of the legs.

FIG. 16 shows a joint according to FIG. 13 with, in turn, another configuration of the tapering and the overlap area 39 of the legs 36, 37. The tapering here is designed as a recess in the leg 36 that is closed on the front side and in which the longer part of the end section of the leg 37, designed in stages, engages with corresponding further reduction of the overlap area.

Figure 17:
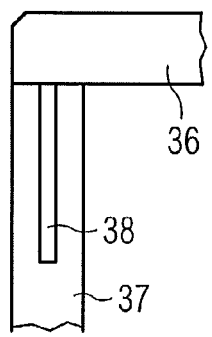
FIG. 17 shows, in a detailed view, a joint according to FIG. 1 in the assembled state.

In FIG. 17, a joint according to FIG. 1 is depicted in the assembled state.

Figure 18:
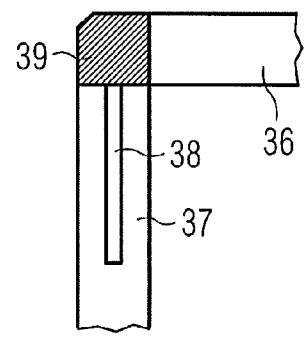
FIG. 18 shows, in a detailed view, a joint according to FIG. 6, in which the recess does not extend into the overlap area.

FIG. 18 shows a joint according to FIG. 6, in which the recess 38 does not extend into the overlap 39.

Figure 19:
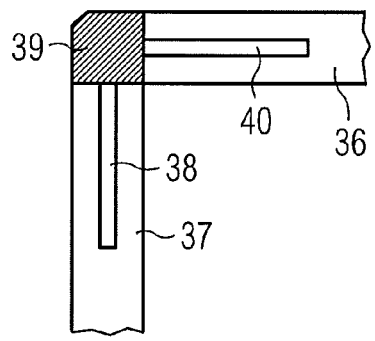
FIG. 19 shows, in a detailed view, a joint with two recesses that adjoin the overlap area.

The subject of FIG. 19 is a joint with two recesses 38, 40 that adjoin the overlap 39.

Figure 20:
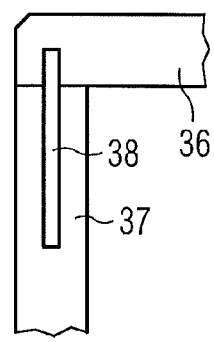
FIG. 20 shows, in a detailed view, a joint according to FIG. 17 with a recess extended into the other leg.

FIG. 20 shows a joint according to FIG. 17 with a recess that is extended into the other leg.

Figure 21:
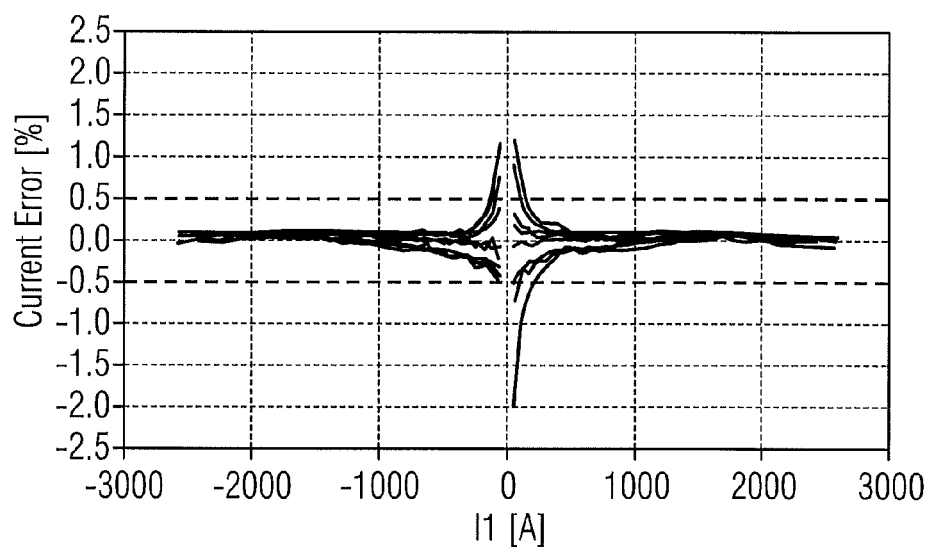
FIG. 21 shows, in a graph, the measured linearity in a magnetic core with no air gap for various primary conductor positions as a current error over the primary current.

FIG. 21 shows the current error in % as a function of the current that is to be measured for different positions of the primary conductor (back-and-forth guiding) with the magnetic module according to FIG. 8 via the primary current I1. As can be seen therefrom, the current error for higher currents (>500 A) is very low and approximately linear by 0%, in any case, however, clearly within an error range of −0.5% to +0.5%.

Figure 22:
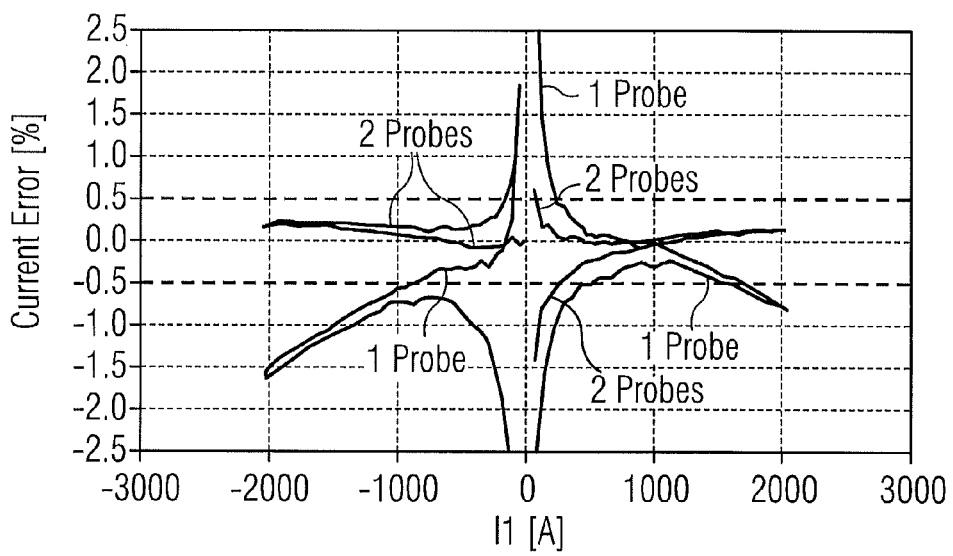
FIG. 22 shows, in a graph, the linearities of magnetic modules with probe as well as with two probes as a current error via the primary current.

FIG. 22 also shows the current error in percent over the primary current I1 in amperes when only one probe is used and when two probes are used. As can be seen, an arrangement with two magnetic field probes is considerably more linear than an arrangement with only one probe. In terms of amount, the arrangement with two magnetic field probes has reached a current error of below 0.5% even with currents with amounts of more than 200 A, while in the case of only one magnetic field probe, the plot at most points outside of the range has a current error of between −0.5 and +0.5%.

Figure 23:
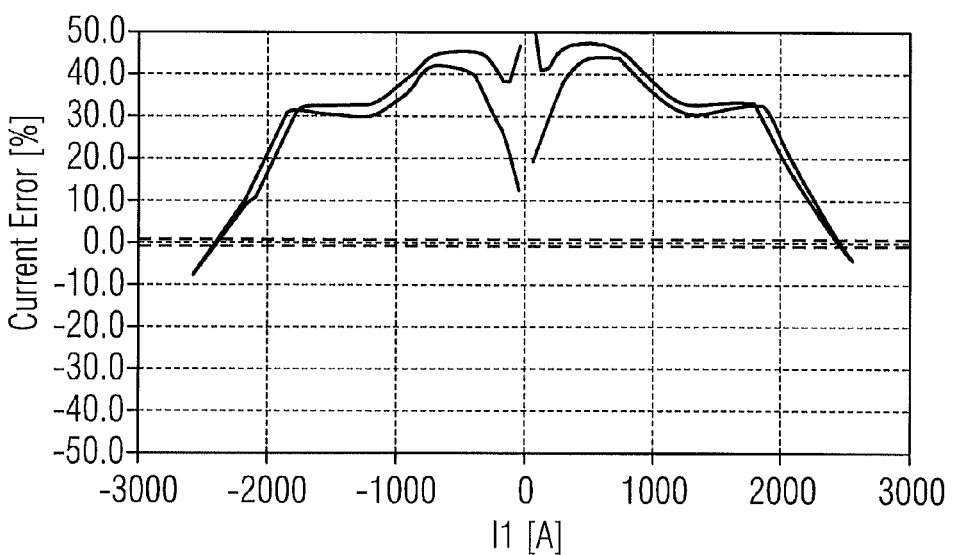
FIG. 23 shows, in a graph, the linearity of a current sensor with two inside tangential field probes as a current error over the primary current.

FIG. 23 shows the linearity of a current sensor with two inside magnetic field probes. The probes are not placed in magnetic core recesses but rather on the inside (inside wall) of the core. The latter thus are located between the primary conductor and the magnetic core. In this connection, the magnetic field that is tangential to the core is measured.

The invention claimed is:

1. A current sensor comprising:
a primary conductor for conducting a current that is to be measured,
at least two magnetic field probes for measuring magnetic fields, and
a magnetic core, which has a closed, ring structure having three or more corners that encloses the primary conductor, and which has at least two legs formed from soft-magnetic material, which are joined to one another by formed on their ends, wherein each magnetic field probe is arranged on the magnetic core or in recesses in the magnetic core;
wherein each leg comprises a sheet-metal stack that consists of stacked soft-magnetic pieces of sheet-metal, wherein for each leg, a first part of the piece of sheet-metal is arranged to project relative to the joint and a second part is arranged shifted to the rear relative to the joint, wherein for the other leg forming the joint the pieces of sheet-metal overlap those of the other leg at the joint, and wherein the joints form air gaps, and
wherein the at least two magnetic field probes adjoin the overlaps for measuring the magnetic fields in the air gaps.

2. The current sensor according to claim 1, wherein the magnetic core has at least two recesses that receive one of the magnetic field probes in each case.

3. The current sensor according to claim 1, wherein the leg formed from soft magnetic material are curved.

4. The current sensor according to claim 3, wherein the magnetic core has two L-shaped legs assembled to form a quadrilateral shaped magnetic core.

5. The current sensor according to claim 1, further comprising an air gap at the joint formed by the overlapping sheet-metal pieces.

6. The current sensor according to Claim 1, wherein at least two pieces of sheet-metal have different alloys and/or sheet-metal thicknesses.

7. The current sensor according to claim 3, wherein at least one of the recesses extends over the joints into the two legs that are joined to one another in each case.

8. The current sensor according to claim 3, wherein at least one of the recesses adjoins the joints.

9. The current sensor according to claim 2, wherein two of the recesses of the magnetic core in each case are closed on four, five or six sides with magnetic material.

10. The current sensor according to claim 1, wherein the magnetic field probes are arranged at the same distances along the periphery of the magnetic core.

11. The current sensor according to claim 1, further comprising a primary conductor guide for both rectangular and round primary conductors located in a magnetic core opening that is surrounded by a magnetic core, wherein the primary conductor guide has a solid body with a round guide opening that is arranged to overlap relative to the magnetic core opening and with a rectangular guide opening that is arranged to overlap and that extends past the round guide opening.

12. The current sensor according to claim 1, further comprising at least one winding applied to the magnetic core.

13. The current sensor according to claim 4, wherein two of the L-shaped legs that form the magnetic core are provided in each case with two windings applied thereto, which are arranged in each case on one end each of the leg and in each case have an extension along the leg, which is less than half the length of the L-shaped basic structure.

14. The current sensor according to claim 1, further comprising at least three windings on the core distributed at the same distance from one another over the periphery of the core.

\* \* \* \* \*